(12) United States Patent
Lee

(10) Patent No.: US 7,897,441 B2
(45) Date of Patent: Mar. 1, 2011

(54) METHOD OF FABRICATING A CMOS IMAGE SENSOR

(75) Inventor: Sang Gi Lee, Bucheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 517 days.

(21) Appl. No.: 11/948,786

(22) Filed: Nov. 30, 2007

(65) Prior Publication Data

US 2008/0157144 A1    Jul. 3, 2008

(30) Foreign Application Priority Data

Dec. 29, 2006    (KR) ...................... 10-2006-0137363

(51) Int. Cl.
*H01L 21/8232* (2006.01)

(52) U.S. Cl. .................. 438/142; 438/48; 438/199; 438/313; 257/292; 257/E21.002

(58) Field of Classification Search ......... 438/197–238, 438/309–327, 580–583
See application file for complete search history.

(56) References Cited

U.S. PATENT DOCUMENTS 7,098,114 B1    8/2006    Syau et al.

2003/0211662 A1 *  11/2003  Yamazaki et al. ........... 438/142
2006/0192250 A1 *   8/2006  Lee ............................. 257/338

OTHER PUBLICATIONS

Office Action dated Jun. 5, 2009 issued by the State Intellectual Property Office for counterpart Chinese Application No. 200710161135.6.

* cited by examiner

*Primary Examiner*—Dung A. Le
(74) *Attorney, Agent, or Firm*—Workman Nydegger

(57) ABSTRACT

A method of fabricating a CMOS image sensor comprising forming an epitaxial layer on a semiconductor substrate, the epitaxial layer comprising a pixel and logic area, forming an STI layer in the epitaxial layer, forming a plurality of wells and a gate pattern having a spacer on the epitaxial layer, forming a plurality of source and drain regions in the epitaxial layer using ion implantation, forming a salicide blocking layer on the epitaxial layer and gate pattern in the pixel area, forming a plurality of silicide layers in the logic area by performing a silicidation process, sequentially forming a PMD liner nitride layer and a PSG layer on the salicide blocking layer in the pixel area and the epitaxial layer and the gate pattern in the logic area, and forming a plurality of contacts connecting the PSG layer to the source and drain regions.

11 Claims, 3 Drawing Sheets

METHOD OF FABRICATING A CMOS IMAGE SENSOR

CROSS-REFERENCES AND RELATED APPLICATIONS

This application claims the benefit of the Korean Patent Application No. 10-2006-0137363, filed on Dec. 29, 2006, which is hereby incorporated by reference in its entirety.

BACKGROUND OF THE INVENTION

1. Field of the Invention

The present invention relates to an image sensor. More particularly, the present invention relates to a CMOS image sensor and fabricating method the same.

2. Discussion of the Related Art

Generally, an image sensor is a device which is capable of converting an optical image into an electric signal. Within the image sensors industry, the sensors are typically categorized as either CMOS (complementary metal-oxide-silicon) image sensors or CCS (charge coupled device) image sensors.

The CCD image sensors have superior noise and photo sensitivity characteristics when compared to the CMOS image sensors, but have difficulties achieving the density required for highly integrated systems and reducing their high power consumption. On the contrary, the CMOS image sensors use simpler processes and have relatively lower power consumption characteristics, making them more suitable for the density requirements of highly integrated systems than the CCD image sensors.

As the technology for fabricating semiconductor devices continues to develop, many efforts have been focused on researching and developing the CMOS image sensor. Because of these advances, improved fabricating technologies and improved characteristics of the CMOS image sensors have been discovered.

In one CMOS image sensor fabricating method currently used in the art, both salicidation and silicidation processes are simultaneously performed, making it difficult to adequately form a borderless contact in a non-salicide area. Thus, the salicide blocking oxide layer is formed in the non-salicide area with an increased thickness, creating a height difference between the pixel area and logic area. This difference in height creates problems when using a PMD (pre-metal dielectric) liner nitride layer as a contact etch stop layer.

More specifically, when an etching process is performed in order to form the contact, the etch stop time used to create the contact etch stop layer in the non-salicide area is different than the etch stop time used to form the contact etch stop layer in a salicide area.

When the contact etch stop layer in the salicide area is used as a contact etch stop target, the oxide layer beneath the contact etch stop layer in the non-salicide area is also etched. Thus, when the contact etch stop layer in the salicide area is etched, an oxide layer in an STI area of the non-salicide area is etched as well. Because a portion of the oxide layer in the STI area is etched, the leakage current in the borderless contact area is increased.

In particular, referring to FIG. 1, in the method for fabricating a CMOS image sensor of the related art, a pixel area having a photodiode 1 is formed on an epitaxial layer using an epitaxy process. A logic area having a plurality of devices for signal processing is formed on a semiconductor substrate, STI CMP is carried out to form a STI (shallow trench isolation) layer 2, and a gate oxide layer pattern 3 and a gate polysilicon pattern 4 are then formed to provide a gate area.

After forming a sidewall, source and drain 5 are formed by ion implantation process. A plurality of silicide layers 6 are then formed in the logic area only.

After a plurality of the silicide layers 6 have been formed, a PMD liner nitride layer 7 and a PSG (phosphosilicate glass) layer 9 are formed. CMP is carried out on the PSG layer 9 to planarize the surface of the PSG layer 9. A contact area 8 is then formed by a contact forming process. If the method is carried out in the above-explained manner, a portion of the oxide in the oxide layer is lost in a non-salicide area, i.e., in the area extending the STI area 2 beneath the contact 8 in the pixel area. If the oxide is lost in the STI area 2, however, the source and drain junction depth under the contact 8 is reduced, resulting in an increased electric field, and increased current leakage.

BRIEF SUMMARY OF THE INVENTION

The present invention is directed to a CMOS image sensor and method of fabricating the same that substantially obviates one or more problems, limitations, or disadvantages of the related art.

An object of the present invention is to provide a method of fabricating a CMOS image sensor, in which a leakage current is prevented by performing a borderless contact forming process in a non-salicide area.

Another object of the present invention is to provide a CMOS image sensor capable of preventing a leakage current by forming a borderless contact in a non-salicide area.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained using the structure particularly pointed out in the written description, claims, and the appended drawings.

To achieve these objects and other advantages and in accordance with the purpose of the invention, one aspect of the invention is a method of fabricating a CMOS image sensor. The method comprises forming an epitaxial layer on a semiconductor substrate, the epitaxial layer comprising a pixel area including a plurality of photodiodes and a logic area including a plurality of devices for capable of performing signal processing, forming a shallow trench isolation (STI) layer in the epitaxial layer, forming a plurality of wells in the epitaxial layer having the STI layer and forming a gate pattern having a spacer on the epitaxial layer having the STI layer, forming a plurality of source and drain regions in the epitaxial layer using an ion implantation process, forming a salicide blocking layer on the epitaxial layer and gate pattern in the pixel area in order to prevent salicidation in the pixel area, forming a plurality of silicide layers in the logic area by performing a silicidation process on the logic area, sequentially forming a pre-metal dielectric (PMD) liner nitride layer and a phosphosilicate glass (PSG) layer on the salicide blocking layer in the pixel area and the epitaxial layer and the gate pattern in the logic area, and forming a plurality of contacts from a surface of the PSG layer to the plurality of source and drain regions.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention are incorporated in and constitute a part of this application. The drawings illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2E are cross-sectional diagrams illustrating a method of fabricating a CMOS image sensor according to one embodiment of the present invention, which show a borderless contact being formed in the non-salicide area by performing both salicidation and silicidation processes.

Figure 1:
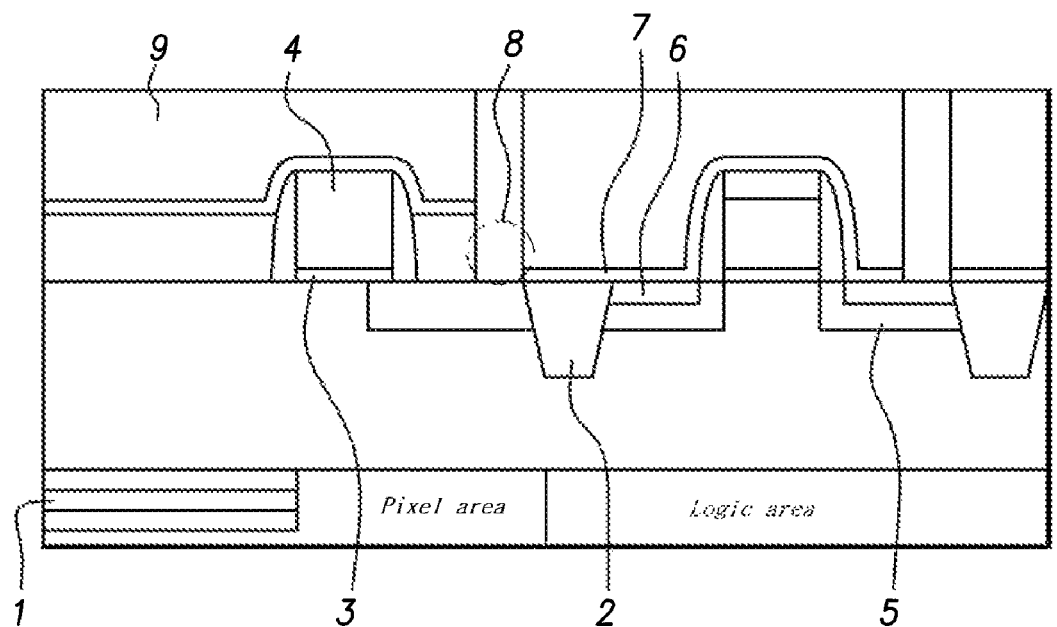
FIG. 1 is a cross-sectional diagram of a CMOS image sensor according to a related art.
Figure 2A:
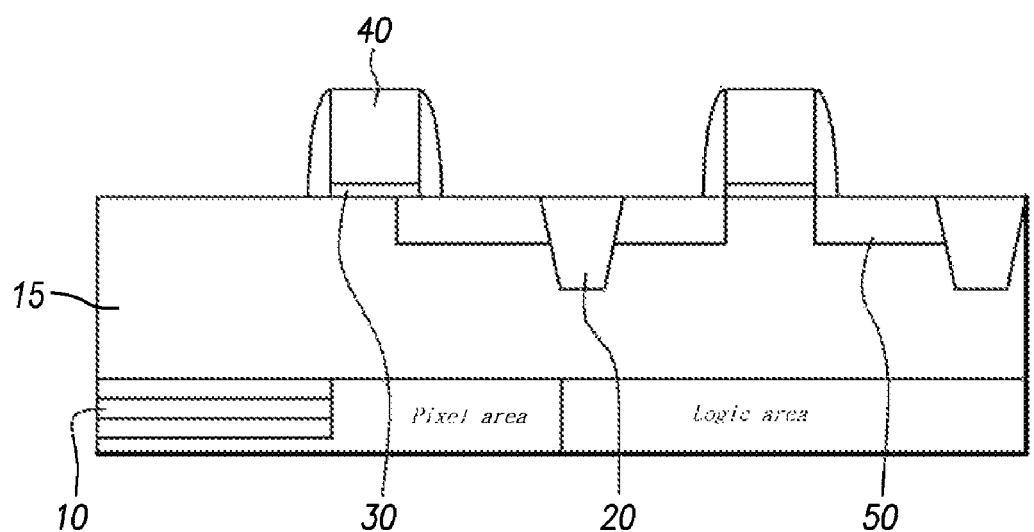
FIGS. 2A to 2E are cross-sectional diagrams which illustrate a method of fabricating a CMOS image sensor according to one embodiment of the present invention.

Referring to FIG. 2A, an epitaxial layer 15 is formed on a semiconductor substrate by an epitaxy process.

Then, the epitaxial layer 15 is divided into a pixel area including a plurality of photodiodes 10 and a logic area with a plurality of devices which are capable of signal processing. Next, STI CMP is then carried out to form an STI (shallow trench isolation) layer 20 in the epitaxial layer 15.

Ion implantation is then carried out on the epitaxial layer 15 in order to form a plurality of wells including n wells and p wells (not shown). A gate pattern including a gate oxide layer pattern 30 and a gate polysilicon pattern 40 is formed on the surface of the epitaxial layer 15 in a gate area.

Subsequently, a spacer of silicon oxide is formed on both sidewalls of the gate oxide layer pattern 30 and the gate polysilicon pattern 40.

Then, after the spacers are formed on the gate pattern, a plurality of source and drain regions 50 are formed. For instance, after completion of the gate pattern, the source and drain regions 50 are formed using an ion implantation process.

Figure 2B:
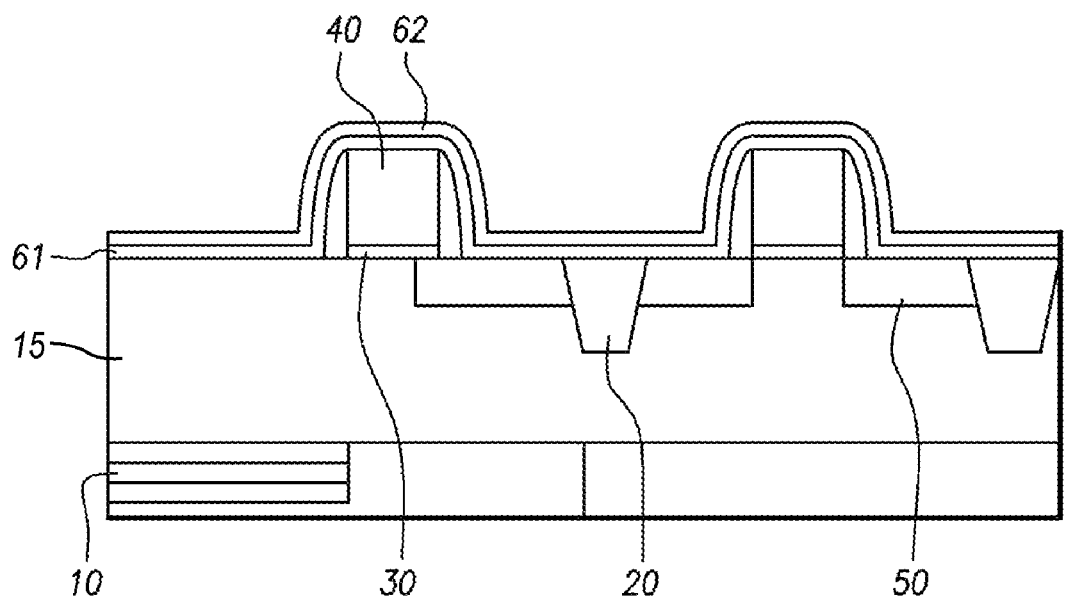

As shown in FIG. 2B, after the source and drain regions 50 are completed, an oxide layer 61 and a nitride layer 62 are sequentially deposited on the epitaxial layer 15 and gate pattern having the spacer, in order to form a salicide-blocking layer in the pixel area.

In one embodiment, the salicide blocking layer includes an oxide layer 61 formed with a thickness of between 100 and 200 Å and a nitride layer with a thickness of between 100 and 200 Å. Thus, a borderless contact may be formed using a thin salicide blocking layer.

Figure 2C:
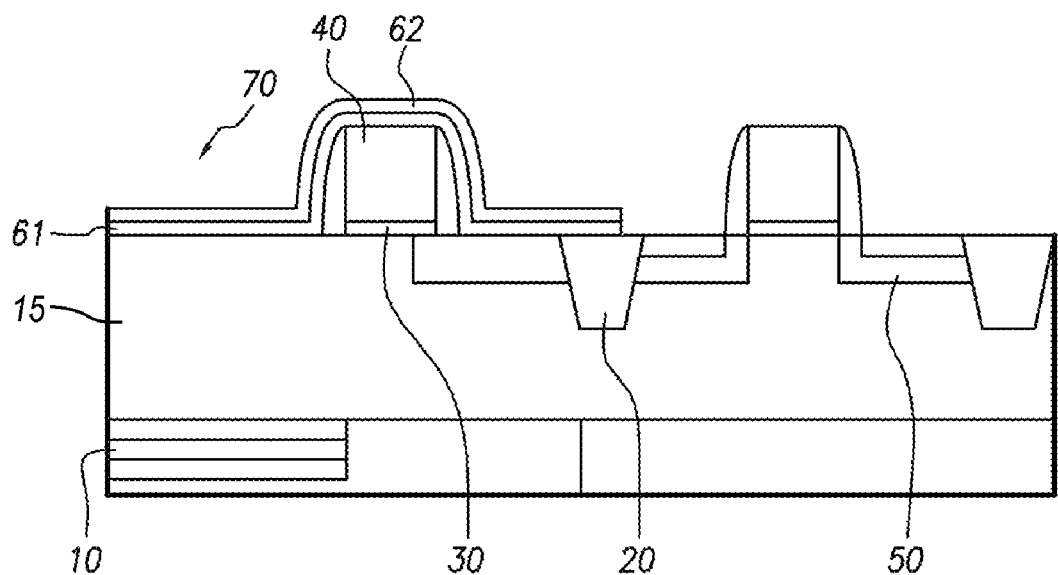

Then, referring to FIG. 2C, a photoresist pattern 70 is formed on the nitride layer 62 in the pixel area in order to form a non-salicidation area on the pixel area. Then, the oxide layer 61 and the nitride layer 62 are removed from the logic area using an etching process.

Figure 2D:
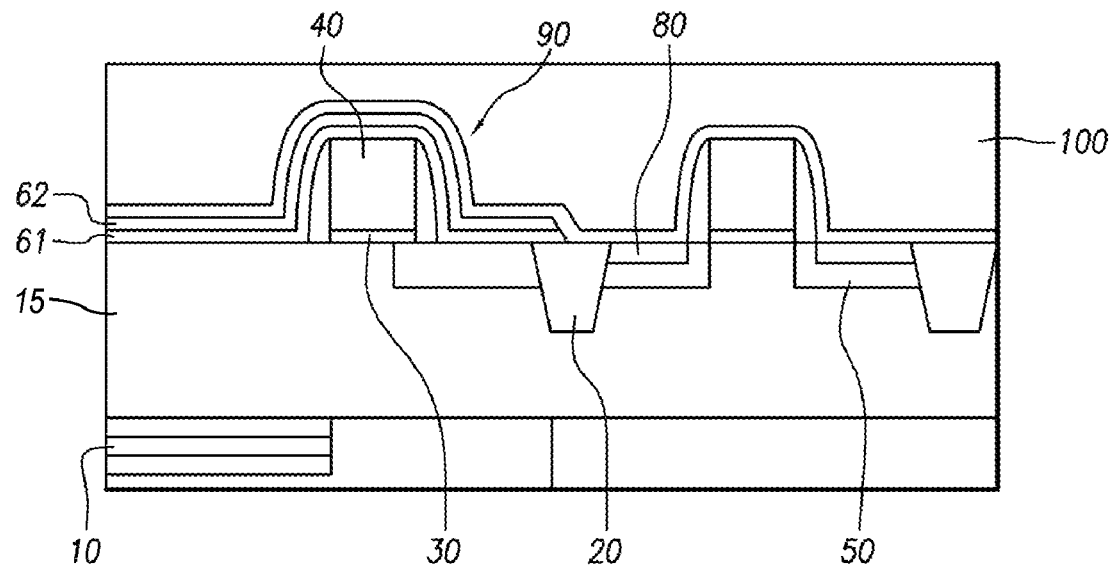

Referring to FIG. 2D, after the oxide layer 61 and the nitride layer 62 have been removed from the logic area by an etching process, silicidation is carried out by depositing a high melting point metal such as Co, Ti, and the like. Then, the photoresist pattern 70 is then removed in an ashing process. Rapid annealing is then performed at temperature of between 800 and 1,000° C. in an Ar gas ambience for 20 seconds in order to form a silicide layer 80.

After the silicide layer 80 has been formed, a PMD liner nitride layer 90 is formed over the salicide-blocking layer in the pixel area and over the epitaxial layer 15 and gate pattern in the logic area. A thick PSG (phosphosilicate glass) layer 100 is then formed on the PMD liner nitride layer 90. The PSG layer 100 is then planarized by a CMP process.

Figure 2E:
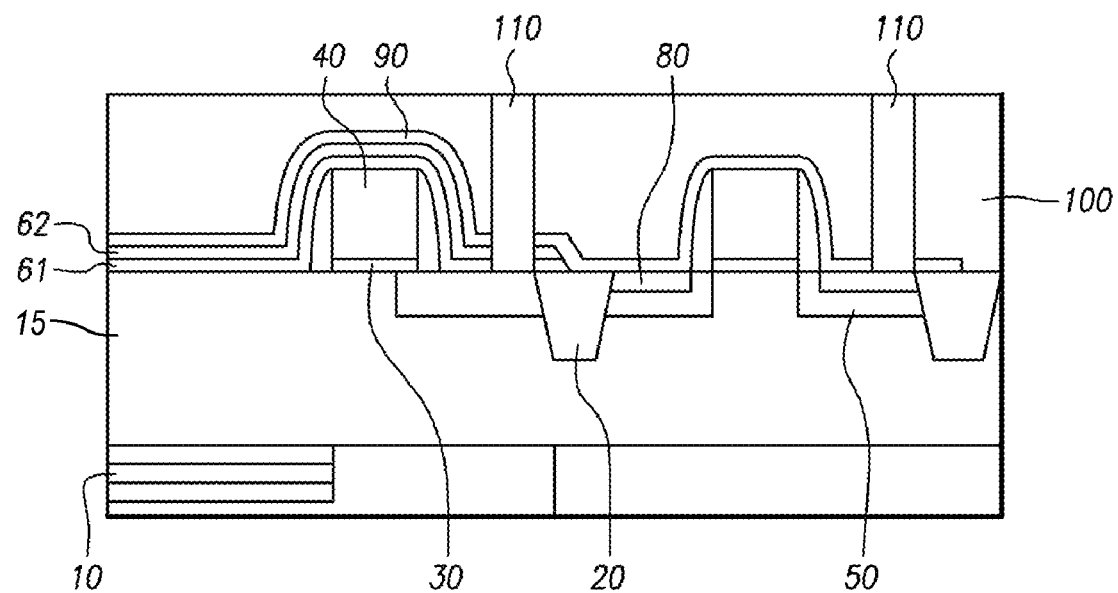

Referring to FIG. 2E, after the PSG layer 100 has been planarized, a photoresist pattern for opening a contact area is formed on the PSG layer 100 to form a plurality of contacts 110, including a borderless contact in the pixel area. A plurality of contact holes are then formed by a dry etching process such as a RIE (reactive ion etch) process, using the photoresist pattern an etching mask.

A plurality of the contact holes are filled up with metal material. A CMP process is then performed to form a plurality of contacts 110 including a borderless contact which is connected to the source and drain regions in the pixel area.

Thus, one aspect of the invention is a method for fabricating a CMOS image sensor, wherein an etch is carried out so as to form a plurality of the contacts 110 using a thin salicide-blocking layer as a contact etch stop layer along with the PMD liner nitride layer 90. So, the PMD liner nitride layer 90 is also able to block the salicidation, so as to form a non-salicide area in the pixel area.

Thus, when the contact etch for forming the non-salicide area is carried out in the pixel area, the etch is stopped at the PMD liner nitride layer 90. So, it is able to form the borderless contact without oxide loss in the STI layer 20.

Since the borderless contact can be formed without oxide loss in the STI layer 20, the leakage current can be prevented from being generated and the size of the image sensor can be reduced by using the thin salicide blocking layer.

Accordingly, the present invention provides the following effects or advantages:

Firstly, when performing a contact etch in a pixel area, a PMD liner nitride layer and a salicide blocking layer can stop the etch. Hence, the present invention is able to form a borderless contact without oxide loss of an STI layer.

Secondly, the present invention forms a borderless contact without oxide loss of an STI layer, thereby enhancing the problem of leakage current generation. And, the present invention reduces a size of a CMOS image sensor by using a thin salicide blocking layer.

It will be apparent to those skilled in the art that various modifications and variations can be made in the present invention without departing from the spirit or scope of the invention. Thus, it is intended that the present invention covers the modifications and variations of this invention that come within the scope of the appended claims and their equivalents.

What is claimed is:

1. A method of fabricating a CMOS image sensor, comprising:
   forming an epitaxial layer on a semiconductor substrate, the epitaxial layer comprising a pixel area including a plurality of photodiodes and a logic area including a plurality of devices capable of performing signal processing;
   forming a shallow trench isolation (STI) layer in the epitaxial layer;

forming a plurality of wells in the epitaxial layer having the STI layer and forming a gate pattern having a spacer on the epitaxial layer having the STI layer;

forming a plurality of source and drain regions in the epitaxial layer using an ion implantation process;

forming a salicide blocking layer on the epitaxial layer and gate pattern in the pixel area in order to prevent salicidation in the pixel area;

forming a plurality of silicide layers in the logic area by performing a silicidation process on the logic area;

sequentially forming a pre-metal dielectric (PMD) liner nitride layer and a phosphosilicate glass (PSG) layer on the salicide blocking layer in the pixel area and the epitaxial layer and the gate pattern in the logic area; and forming a plurality of contacts from a surface of the PSG layer to the plurality of source and drain regions.

2. The method of claim 1, wherein forming the salicide blocking layer comprises sequentially depositing an oxide layer and a nitride layer on the epitaxial layer and gate pattern in the pixel area.

3. The method of claim 2, wherein the oxide layer is formed with a thickness of between 100 and 200 Å and wherein the nitride layer is formed on the oxide layer with a thickness of between 100 and 200 Å.

4. The method of claim 1, wherein forming the silicide layer comprises:

forming a photoresist pattern on the salicide blocking layer;

removing the salicide blocking layer in the logic area using the photoresist pattern as a mask in an etching process;

depositing a high melting point metal on the semiconductor substrate over photoresist pattern;

removing the photoresist pattern by performing an ashing process; and performing a rapid annealing process to form the silicide layer.

5. The method of claim 4, wherein the rapid annealing process is carried out at a temperature between 800 and 1,000° C. in an Ar gas ambience for 20 seconds.

6. The method of claim 4, wherein the high melting point metal comprises either Co or Ti.

7. A method of fabricating a CMOS image sensor, comprising:

forming an epitaxial layer on a semiconductor substrate, the epitaxial layer comprising a pixel area including a plurality of photodiodes and a logic area including a plurality of devices capable of performing signal processing;

forming a shallow trench isolation (STI) layer in the epitaxial layer;

forming a plurality of wells in the epitaxial layer having the STI layer and forming a gate pattern having a spacer on the epitaxial layer having the STI layer;

forming a plurality of source and drain regions in the epitaxial layer using an ion implantation process;

forming a salicide blocking layer on the epitaxial layer and gate pattern in the pixel area by depositing an oxide layer and a nitride layer on the epitaxial layer and gate pattern in the pixel area in order to prevent salicidation in the pixel area;

forming a photoresist pattern on the salicide blocking layer;

removing the salicide blocking layer in the logic area using the photoresist pattern as a mask in an etching process;

depositing a high melting point metal on the semiconductor substrate over photoresist pattern;

removing the photoresist pattern by performing an ashing process;

performing a rapid annealing process to form a silicide layer;

sequentially forming a pre-metal dielectric (PMD) liner nitride layer and a phosphosilicate glass (PSG) layer on the salicide blocking layer in the pixel area and the epitaxial layer and the gate pattern in the logic area; and forming a plurality of contacts from a surface of the PSG layer to the plurality of source and drain regions.

8. The method of claim 7, wherein the rapid annealing process is carried out at a temperature between 800 and 1,000° C. in an Ar gas ambience for 20 seconds.

9. The method of claim 7, wherein the high melting point metal comprises either Co or Ti.

10. The method of claim 7, wherein forming the salicide blocking layer comprises sequentially depositing an oxide layer and a nitride layer on the epitaxial layer and gate pattern in the pixel area.

11. The method of claim 10, wherein the oxide layer is formed with a thickness of between 100 and 200 Å and wherein the nitride layer is formed on the oxide layer with a thickness of between 100 and 200 Å.

* * * * *